(12) United States Patent
Fukuda et al.

(10) Patent No.: US 8,853,014 B2
(45) Date of Patent: Oct. 7, 2014

(54) METHOD OF FABRICATING A THIN-FILM TRANSISTOR

(75) Inventors: Toshio Fukuda, Kanagawa (JP); Yui Ishii, Kanagawa (JP)

(73) Assignee: Sony Corporation (JP)

( * ) Notice: Subject to any disclaimer, the term of this patent is extended or adjusted under 35 U.S.C. 154(b) by 142 days.

(21) Appl. No.: 13/414,842

(22) Filed: Mar. 8, 2012

(65) Prior Publication Data

US 2012/0248633 A1 Oct. 4, 2012

(30) Foreign Application Priority Data

Apr. 1, 2011 (JP) ................................ 2011-081404

(51) Int. Cl.
| | | |
|---|---|---|
| H01L 21/00 | (2006.01) | |
| H01L 29/76 | (2006.01) | |
| H01L 51/00 | (2006.01) | |
| H01L 51/05 | (2006.01) | |
| H01L 27/32 | (2006.01) | |
| G02F 1/1368 | (2006.01) | |
| G02F 1/167 | (2006.01) | |

(52) U.S. Cl.
CPC ........... *H01L 51/003* (2013.01); *H01L 51/0545* (2013.01); *H01L 27/3244* (2013.01); *H01L 51/0512* (2013.01); *H01L 51/0541* (2013.01); *G02F 1/1368* (2013.01); *G02F 1/167* (2013.01); *H01L 51/0097* (2013.01); *Y02E 10/549* (2013.01); *G02F 2202/02* (2013.01)
USPC ............................ 438/151; 438/763; 257/288

(58) Field of Classification Search
CPC .............. H01L 51/003; H01L 51/0097; H01L 51/0541; H01L 51/0545; H01L 27/3248; H01L 27/1266; H01L 27/1214; H01L 21/6835
See application file for complete search history.

(56) References Cited

U.S. PATENT DOCUMENTS

| 6,700,631 | B1 * | 3/2004 | Inoue et al. ..................... 349/45 |
|---|---|---|---|
| 8,508,682 | B2 * | 8/2013 | Yamazaki et al. ............... 349/45 |
| 2003/0032210 | A1 * | 2/2003 | Takayama et al. ............... 438/30 |
| 2005/0056842 | A1 * | 3/2005 | Nishi et al. ....................... 257/66 |
| 2008/0171484 | A1 * | 7/2008 | Yamashita et al. .............. 445/24 |
| 2009/0075456 | A1 * | 3/2009 | Akimoto et al. ............... 438/458 |
| 2012/0187399 | A1 * | 7/2012 | Fukuda et al. ................... 257/43 |

FOREIGN PATENT DOCUMENTS

| JP | 2001-057432 | 2/2001 |
|---|---|---|
| JP | 2007-512568 | 5/2007 |
| WO | 03/016599 | 2/2003 |

* cited by examiner

*Primary Examiner* — Alonzo Chambliss
(74) *Attorney, Agent, or Firm* — Sheridan Ross P.C.

(57) ABSTRACT

There is provided a method of manufacturing a thin-film device, the method including forming a first substrate on a supporting base by a coating method, the first substrate being formed by using a resin material; forming a second substrate on the first substrate by using any one of a thermosetting resin and energy ray-curable resin; forming an active element on the second substrate; and removing the supporting base from the first substrate. The resin material used to form the first substrate has a glass transition temperature of at least 180° C.

17 Claims, 3 Drawing Sheets

METHOD OF FABRICATING A THIN-FILM TRANSISTOR

BACKGROUND

The present disclosure relates to a thin-film device, a method of manufacturing the thin-film device, and a method of manufacturing an image display apparatus.

A field effect transistor (FET) includes thin-film transistor (TFT) which is currently used in many types of electronic equipment. For example, the FET has a configuration including a channel forming region and source/drain electrodes which are each formed in a silicon semiconductor substrate or a layer of a silicon semiconductor material, a gate insulating layer which is formed by using $SiO_2$ on a surface of the silicon semiconductor substrate or layer of a silicon semiconductor material, and a gate electrode that is formed so as to face the channel forming layer through the gate insulating layer. The FET having this configuration is referred to as a top gate-type FET for convenience of description. Alternatively, the FET has another configuration including the gate electrode formed on a substrate, the gate insulating layer which is formed by using $SiO_2$ so as to overlie the gate electrode and substrate, and the channel forming region and source/drain electrodes which are formed on the gate insulating layer. The FET having this configuration is referred to as a bottom gate-type FET for convenience of description. Expensive semiconductor-manufacturing equipment is used to produce the FET having such configurations, and the decrease of production costs is therefore strongly demanded.

In recent years, electronic devices in which a thin film made from an organic semiconductor material is used have been intensely developed, and organic electronic devices (hereinafter simply referred to as organic devices, where appropriate) such as an organic transistor, organic light emitting device, and organic solar battery attract attention. The organic devices are developed to finally provide advantages including reduced costs, reduced weight, sufficient elasticity, and high performance. As compared with inorganic materials typified by silicon, the organic semiconductor materials have several advantages such as: (1) enabling a large-area organic device to be produced through an easy process at low temperature, (2) enabling an elastic organic device to be produced, and (3) enabling the performance and physical properties of the organic devices to be controlled as a result of modifying molecules contained in organic materials into a desired form.

In particular, study of coating film-forming techniques such as a printing technique has been developed as an easy process at low temperature (see WO2003/016599).

In order to produce the organic devices through an easy process at low temperature, various types of layers other than an active layer (channel-forming region, for instance) are also obviously formed at a low temperature process. Therefore, a study has been advanced to form an insulating film from the organic materials (specifically a coating material formed as a result of melting a polymer), and a study has been similarly advanced to form various electrodes from a material containing dispersed metallic nanoparticles (specifically silver paste) which enable conductivity to be secured after being sintered at low temperature.

SUMMARY

For example, since organic transistors can be produced through a low temperature process, a plastic film can be used in place of a traditional silicon wafer to form a substrate. Although the plastic film is an elastic material with a light weight, it is significantly difficult to handle the plastic film alone. A supporting base is therefore used in the production of the organic transistors. A technique is accordingly typically used, in which a solution of a polyimide resin, for instance, is applied to a supporting base such as a glass substrate to form a polyimide film on the supporting base. In this case, however, the polyimide film has a difficulty in being removed from the supporting base. In general, a laser ablation method using an excimer laser or the like is therefore employed to remove the polyimide film from the supporting base [see Japanese Unexamined Patent Application Publication (Translation of PCT Application) No. 2007-512568], and a large-scale equipment is used in this case. Another technique is also typically employed, in which the plastic film is removed from the supporting base as a result of removing a sacrificing layer, which has been formed in advance, by the laser ablation method (see Japanese Unexamined Patent Application Publication No. 2001-057432). Unfortunately, large-scale equipment is used also in this case.

It is accordingly desirable to provide the following: a method of manufacturing a thin-film device, the method enabling an active element to be produced through a simple and easy process without large-scale equipment; a thin-film device which is produced by the method; a method of manufacturing an image display apparatus, the method including the method of manufacturing the thin-film device.

According to an embodiment of the present disclosure, there is provided a method of manufacturing a thin-film device, the method including forming a first substrate on a supporting base by a coating method, the first substrate being formed by using a resin material; forming a second substrate on the first substrate by using any one of a thermosetting resin and energy ray-curable resin; forming an active element on the second substrate; and removing the supporting base from the first substrate. In this method, the resin material used for the first substrate has a glass transition temperature of at least 180° C.

According to another embodiment of the present disclosure, there is provided a method of manufacturing a thin-film device, the method including forming a first substrate on a supporting base by a coating method, the first substrate being formed by using a resin material; forming a second substrate on the first substrate by using any one of a thermosetting resin and energy ray-curable resin; forming an active element on the second substrate; and removing the supporting base from the first substrate. In this method, the resin material used for the first substrate has a glass transition temperature higher than the maximum of a processing temperature during the formation of the active element.

According to another embodiment of the present disclosure, there is provided a method of manufacturing a thin-film device, the method including forming a first substrate on a supporting base by a coating method, the first substrate being formed by using an amorphous thermoplastic resin; forming a second substrate on the first substrate by using any one of a thermosetting resin and an ultraviolet curable resin; forming an active element on the second substrate; and removing the supporting base from the first substrate.

According to another embodiment of the present disclosure, there is provided a method of manufacturing an image display apparatus, the method including the method of manufacturing a thin-film device according to the above embodiments of the present disclosure.

According to another embodiment of the present disclosure, there is provided a thin-film device including a first substrate, a second substrate formed on the first substrate, and an active element formed on the second substrate. In the thin-film device, a resin material is used to form the first substrate and has a glass transition temperature of at least 180° C., and any one of a thermosetting resin and energy ray-curable resin is used to form the second substrate.

According to another embodiment of the present disclosure, there is provided a thin-film device including a first substrate, a second substrate formed on the first substrate, and an active element formed on the second substrate. In the thin-film device, a resin material is used to form the first substrate and has a glass transition temperature higher than the maximum of a processing temperature during the formation of the active element of the thin-film device, and any one of a thermosetting resin and energy ray-curable resin is used to form the second substrate.

According to another embodiment of the present disclosure, there is provided a thin-film device including a first substrate, a second substrate formed on the first substrate, and an active element formed on the second substrate. In the thin-film device, an amorphous thermoplastic resin is used to form the first substrate, and any one of a thermosetting resin and an ultraviolet curable resin is used to form the second substrate.

In the methods of manufacturing a thin-film device and method of manufacturing an image display apparatus according to the above embodiments of the present disclosure, the active element is formed on a two-layered structure of the first and second substrates, and the supporting base is then removed from the first substrate. A thin-film device can be therefore manufactured through a simple and easy process without large-scale manufacturing equipment. Furthermore, the first substrate is covered with the second substrate, and the active element is formed on the second substrate in a state in which the first substrate is protected. The first substrate can be therefore steadily prevented from being damaged during the formation of the active element. Moreover, since the first substrate is formed on the supporting base by a coating method, the first substrate can be easily formed, and air bubbles are less likely to be caused between the supporting base and the first substrate. In the thin-film devices according to the above embodiments of the present disclosure, the materials used for the first and second substrates and the properties, details, and particulars of the materials are defined. The thin-film device can be therefore produced through a simple and easy process without large-scale manufacturing equipment.

DETAILED DESCRIPTION OF EMBODIMENTS

Figure 1A:
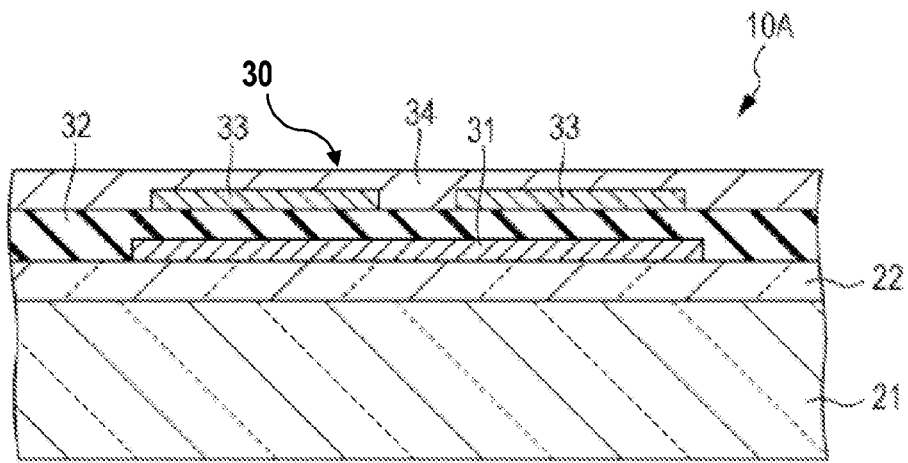
FIG. 1A is a partial cross-sectional view schematically illustrating a thin-film device of an example 1.

Although embodiments of the present disclosure will be described based on examples with reference to the drawings, embodiments of the present disclosure are not limited to the examples. Various numerals and components in the following examples are nothing but an example. Description will be made in the following order: (1) thin-film devices of first to third embodiments of the present disclosure, a method of manufacturing the thin-film devices, a method of manufacturing an image display apparatus, and general description; (2) an example 1 (the thin-film devices of the first to third embodiments of the present disclosure, the method of manufacturing the thin-film devices, and the method of manufacturing an image display apparatus); (3) example 2 (a modification of the example 1); (4) example 3 (another modification of the example 1); (5) example 4 (another modification of the example 1); (6) example 5 (another modification of the example 1); and (7) example 6 (another modification of the example 1) and others.

In the thin-film device of the first embodiment of the present disclosure, the method of manufacturing the thin-film device of the first embodiment, or the method of manufacturing an image display apparatus, which includes the method of manufacturing the thin-film device of the first embodiment (hereinafter collectively referred to as "the first embodiment of the present disclosure"), a resin material which is not cured or cross-linked can be employed as a resin material used for a first substrate, and a material used for a second substrate can contain the resin material used for the first substrate. Since the material used for the second material is employed in this manner, an excellent advantage can be provided, in which removal at the interface between the first and second substrates can be eliminated. In the first embodiment of the present disclosure having such a desirable formation, a peel strength (in particular, 90° peel strength) is preferably exhibited to a supporting base in the range from 1.0 N/cm (0.1 kgf/cm) to 4.9 N/cm (0.5 kgf/cm). The 90° peel strength is defined in accordance with JIS K 6854-1:1999. Specific examples of the resin material used for the first substrate include a polysulfone resin, polyether sulfone resin, and polyetherimide resin. Specific examples of the material used for the second substrate include a polysulfone-containing resin such as a resin which is formed as a result of mixing polyisocyanate or melamine resin as a cross-linker that reacts with a hydroxyl group with a polysulfone resin containing a hydroxyl group at an end group thereof.

In the thin-film device of the second embodiment of the present disclosure, the method of manufacturing the thin-film device of the second embodiment, or the method of manufacturing an image display apparatus, which includes the method of manufacturing the thin-film device of the second embodiment (hereinafter collectively referred to as "the second embodiment of the present disclosure"), the resin material used for the first substrate desirably has a glass transition temperature of 180° C. or higher. In the second embodiment of the present disclosure having such a desirable formation, a peel strength (in particular, 90° peel strength) is preferably exhibited to the supporting base in the range from 1.0 N/cm (0.1 kgf/cm) to 4.9 N/cm (0.5 kgf/cm).

In the thin-film device of the third embodiment of the present disclosure, the method of manufacturing the thin-film device of the third embodiment, or the method of manufacturing an image display apparatus, which includes the method of manufacturing the thin-film device of the third embodiment (hereinafter collectively referred to as "the third embodiment of the present disclosure"), an amorphous thermoplastic resin is used to form the first substrate, and a polysulfone-based resin may be employed as the amorphous thermoplastic resin. In particular, a polysulfone resin, polyether sulfone resin, or polyetherimide resin may be employed as the thermoplastic resin used for the first substrate. In the third embodiment of the present disclosure having such a desirable formation, a thermosetting resin is used to form the second substrate, and an epoxy-based resin may be employed as the thermosetting resin. Specific examples of a preferable combination of the material used for the first substrate and the material used for the second substrate include a polysulfone resin and epoxy-based resin, a polyether sulfone resin and epoxy-based resin, and a polyetherimide resin and epoxy-based resin.

In the first to third embodiments of the present disclosure having desirable formation and structure described above, an active element may be configured so as to include a first and second electrodes, an active layer formed between the first and second electrodes, and a control electrode which faces the active layer through an insulating layer. In this case, the active element may be specifically provided as an organic transistor, more specifically as a three-terminal device in the form of a FET including a TFT. The active element may be configured so as to have the following structure: source/drain electrodes corresponding to the first and second electrodes, a gate electrode corresponding to the control electrode, a gate insulating layer corresponding to the insulating layer, and a channel-forming region corresponding to the active layer. Furthermore, in the first to third embodiments of the present disclosure having desirable formation and structure described above, the active element may be configured so as to include the first electrode, the second electrode, and the active layer formed between the first and second electrodes. In this case, the active element may be specifically provided as a two-terminal device in the form of various types of sensors such as a photoelectric transducer, solar battery, image sensor, and optical sensor. In this case, an organic semiconductor material may be used to form the active layer.

Furthermore, in the first to third embodiments of the present disclosure having desirable formation and structure described above, examples of the active element include an organic electroluminescence device (organic EL device), microcapsule-type electrophoretic display device, semiconductor light-emitting device [semiconductor laser device or light-emitting diode (LED)], and liquid crystal display device. Meanwhile, the organic EL device, microcapsule-type electrophoretic display device, semiconductor light-emitting device, and liquid crystal display device may be formed so as to have traditional formation and structure.

In the second embodiment of the present disclosure having desirable formation and composition described above, examples of the amorphous thermoplastic resin include styrene-based resins such a polystyrene resin, acrylonitrile-butadiene-styrene (ABS) resin, acrylonitrile-ethylene-styrene (AES) resin, and acrylonitrile-styrene (AS) resin; methacrylic resins such as a polymethylmethacrylate (PMMA); polycarbonate resins (including a linear polycarbonate resin and a polycarbonate resin having branching on the main chain); polyphenylene ether (PPE)-based resins such as modified polyphenylene ether; polysulfone resin; polyether sulfone resin; polyarylate resin; polyetherimide resin; polyamide-imide resin; polyether ketone resin; polyetheretherketone resin; polyester carbonate resin; cyclic olefin polymer (COP); cyclic olefin copolymer (COC); and elastomer. Examples of the resin used for the second substrate include thermosetting resins or ultraviolet curable resins such as a phenol resin, urea resin, melamine resin, xylene resin, xylene-formaldehyde resin, diallyl phthalate resin, furan resin, ketone-formaldehyde resin, urea-formaldehyde resin, aniline resin, alkyd resin, unsaturated polyester resin, and epoxy resin.

In general, whether the thermoplastic resin is the amorphous thermoplastic resin or not is determined by measurement of a specific melting point (temperature that exhibits drastic heat absorption) by differential scanning calorimetry (DSC). The resin in which a specific melting point is not measured is the amorphous thermoplastic resin. On the other hand, the resin in which a specific melting point is measured is a crystalline thermoplastic resin.

Examples of an image display apparatus manufactured by the method of manufacturing an image display apparatus according to an embodiment of the present disclosure and an image display apparatus in which the thin-film devices of the first to third embodiments of the present disclosure are incorporated include various types of image display apparatuses such as a desktop personal computer, laptop, mobile personal computer, personal digital assistant (PDA), cellular phone, game machine, electronic book, electronic paper (for example, electronic newspaper), bulletin board (for example, signboard, poster, and blackboard), copying machine, rewritable paper used in place of printing paper, calculator, display of household electric appliance, card display of a point card or the like, electronic advertisement, and electronic point of purchase (POP) advertisement. Furthermore, various types of lightning systems are also included.

The first substrate is formed on the supporting base by a coating method using the resin material. Examples of the coating method include techniques of applying a liquid material, such as various types of printing techniques including screen printing, ink-jet printing, offset printing, reverse offset printing, gravure printing, gravure offset printing, relief printing, flexographic printing, and microcontact printing; a spin coat method; various types of coating techniques including air doctor coating, blade coating, rod coating, knife coating, squeeze coating, reverse roll coating, transfer roll coating, gravure coating, kiss coating, cast coating, spray coating, slit coating, slit orifice coating, calender coating, cast coating, capillary coating, bar coating, and dip coating; spraying; a technique utilizing a dispenser; and stamping.

In order to form the first substrate on the supporting base by using the resin material, a solution in which the resin material is dissolved is prepared. Examples of a solvent include water; alcohols such as ethyl alcohol, isopropyl alcohol, and butyl alcohol; aromatics such as toluene and xylene; ketones such as acetone and 2-butanone; and hydrocarbons such as propylene glycol monomethyl ether acetate (PGMEA), and these solvents may be appropriately used alone or in combination. In addition to the organic solvents, additives such as a surfactant and leveling agent may be added. Furthermore, materials other than polymeric materials may be added depending on aims such as imparting applicability and other properties. Specific examples of such materials include a silica filler and a glass fiber.

A material which does not chemically react with the supporting base is preferably employed as the resin material used for the first substrate. In this case, the expression "not chemically react with the supporting base" means the following: in the case of using glass as the supporting base, for example, the material does not have a reaction group which causes chemical reaction with a hydroxyl group on a surface of the glass. The supporting base is removed from the first substrate, and the removal can be mechanically conducted. In particular, cut lines are made in the first and second substrates overlying the supporting base by machine or hand. Then, the supporting base may be removed from the first substrate by machine or hand, or the first substrate may be removed from the supporting base by machine or hand. Alternatively, cut lines are made in the first and second substrates overlying the supporting base by machine or hand. Then, water is made to intrude from the cut lines, thereby being able to remove the supporting base from the first substrate or being able to remove the first substrate from the supporting base. The first substrate may have a thickness which enables the thin-film device to be steadily supported and which appropriately enables elasticity (flexibility) to be imparted to the thin-film device. For instance, the first substrate may have a thickness that is in the range from $2\times10^{-5}$ m to $2\times10^{-4}$ m. The second substrate may have a thickness which enables the first substrate to be steadily protected from a ketone solvent and which appropriately enables elasticity (flexibility) to be imparted to the thin-film device. For example, the second substrate may have a thickness that is in the range from 1 μm to 10 μm. The thin-film element is formed on the second substrate, and the second substrate therefore preferably has insulating properties.

Although the various types of coating methods described above can be used as the technique of forming the second substrate on the first substrate, such a technique is not limited to the above coating methods. A technique may be employed, in which the second substrate is preliminarily prepared in the form of a sheet and is then stacked on the first substrate.

In the case of configuring the active element in the form of a bottom gate and bottom contact-type TFT, the TFT can be manufactured through the following processes: (a) forming the gate electrode on the second substrate and then forming the gate insulating layer on the entire surface of the resultant product; (b) forming the source/drain electrodes on the gate insulating layer; and (c) forming the channel-forming region so as to overlie the gate insulating layer at a position at least between the source/drain electrodes, the channel-forming region being formed as a layer of an organic semiconductor material. The bottom gate and bottom contact-type TFT has (A) the gate electrode formed on the second substrate; (B) the gate insulating layer formed on the gate electrode and the second substrate; (C) the source/drain electrodes formed on the gate insulating layer; and (D) the channel-forming region formed between the source/drain electrodes so as to overlie the gate insulating layer, the channel-forming region being formed as a layer of an organic semiconductor material.

In the case of configuring the active element in the form of a bottom gate and top contact-type TFT, the TFT can be manufactured through the following processes: (a) forming the gate electrode on the second substrate and then forming the gate insulating layer on the entire surface of the resultant product; (b) forming the channel-forming region and channel-forming region extension on the gate insulating layer, each being formed as a layer of an organic semiconductor material; and (c) forming the source/drain electrodes on the channel-forming region extension. The bottom gate and top contact-type TFT has (A) the gate electrode formed on the second substrate; (B) the gate insulating layer formed on the gate electrode and the second substrate; (C) the channel-forming region and channel-forming region extension formed on the gate insulating layer, each being formed as a layer of an organic semiconductor material; and (D) the source/drain electrodes formed on the channel-forming region extension.

Furthermore, in the case of configuring the active element in the form of a top gate and bottom contact-type TFT, the TFT can be manufactured through the following processes: (a) forming the source/drain electrodes on the second substrate; (b) forming the channel-forming region on the entire surface of the resultant product, the channel-forming region being formed as a layer of an organic semiconductor material; and (c) forming the gate insulating layer on the entire surface of the resultant product and then forming the gate electrode on the gate insulating layer so as to overlie the channel-forming region. The top gate and bottom contact-type TFT has (A) the source and drain electrodes formed on the second substrate; (B) the channel-forming region formed on the second substrate between the source/drain electrodes, the channel-forming region being formed as a layer of an organic semiconductor material; (C) the gate insulating layer formed on the channel-forming region; and (D) the gate electrode formed on the gate insulating layer.

Furthermore, in the case of configuring the active element in the form a top gate and top contact-type TFT, the TFT can be manufactured through the following processes: (a) forming the channel-forming region and channel-forming region extension on the second substrate, each being formed as a layer of an organic semiconductor material; (b) forming the source/drain electrodes on the channel-forming region extension; and (c) forming the gate insulating layer on the entire surface of the resultant product and then forming the gate electrode on the gate insulating layer so as to overlie the channel-forming region. The top gate and top contact-type TFT has (A) the channel-forming region and channel-forming region extension formed on the second substrate, each being formed as a layer of an organic semiconductor material; (B) the source/drain electrodes formed on the channel-forming region extension; (C) the gate insulating layer formed on the source/drain electrodes and on the channel-forming region; and (D) the gate electrode formed on the gate insulating layer.

The active element can be formed so as to have a mechanism in which electric current flowing from the first electrode toward the second electrode through the active layer is controlled by application of a voltage to the control electrode. In particular, as described above, the active element can be formed as a FET (including TFT) so as to have the following configuration: the control electrode corresponds to the gate electrode; the first and second electrodes correspond to the source/drain electrodes; the insulating layer corresponds to the gate insulating layer; and the active layer corresponds to the channel-forming region. Alternatively, the active element can be configured as a light-emitting device (including an organic light-emitting device and organic light-emitting transistor) in which the active layer emits light as a result of applying a voltage to the control electrode and the first and second electrodes. In the light-emitting device, the organic semiconductor material used for the active layer has a function to store electric charges in response to modulation by application of a voltage to the control electrode and to emit light resulting from recombination of injected electrons and holes. Examples of the organic semiconductor material used for the active layer broadly include an organic semiconductor material having p-type conductivity and non-doped organic semiconductor material. In a light-emitting device (organic light-emitting transistor) which has the active layer formed by using the organic semiconductor material having p-type conductivity, emission intensity is proportional to the absolute value of a drain current, and light can be modulated in response to a gate voltage and a voltage applied between the source/drain electrodes. Meanwhile, whether the active element functions as the FET or light-emitting device depends on a state in which a voltage is applied to the first and second electrodes (bias). A bias voltage is applied so as not to cause electron injection from the second electrode, and the control electrode is then modulated in such a state, thereby causing a current to flow from the first electrode toward the second electrode. Transistors function in this manner. In the case of increasing a bias voltage applied to the first and second electrodes in a state in which holes are sufficiently stored, electrons start to be injected, and the electrons recombine with the holes with the result that light is emitted. Furthermore, the active element may be configured as a photoelectric transducer in which current flows between the first and second electrodes as a result of emitting light to the active layer. In the case of forming the active element as the photoelectric transducer, the photoelectric transducer is used to configure, for example, a solar battery and image sensor. In this case, a voltage may be or may not be applied to the control electrode. In the case of applying a voltage to the control electrode, the application of a voltage to the control electrode enables a flowing current to be modulated. In the case of forming the active element as a light-emitting device or photoelectric transducer, for example, the light-emitting device or photoelectric transducer may have formation or structure the same as those of any one of the four types of TFTs describe above.

Examples of the organic semiconductor material include dioxaanthanthrene-based compounds such as polythiophene, poly-3-hexylthiophene (P3HT) in which a hexyl group is introduced into polythiophene, pentacene(2,3,6,7-dibenzoanthracene), peri-Xanthenoxanthene; polyanthracene; naphthacene; hexacene; heptacene; dibenzopentacene; tetrabenzopentacene; chrysene; perylene; coronene; Terrylene; ovalene; quaterrylene; circumanthracene; benzopyrene; dibenzopyrene; triphenylene; polypyrrole; polyaniline; polyacetylene; polydiacetylene; polyphenylene; polyfuran; polyindole; polyvinylcarbazole; polyselenophene; polytellurophene; polyisothianaphthene; polycarbazole; polyphenylene sulfide; polyphenylene vinylene; polyvinylene sulfide; polythienylene vinylene; polynaphthalene; polypyrene; polyazulene; phthalocyanine typified by copper phthalocyanine; merocyanine; hemicyanine; polyethylenedioxythiophene; pyridazine; naphthalenetetracarboxylic diimide; poly(3,4-ethylene dioxythiophene)/polystyrene sulfonate (PEDOT/PSS); and quinacridone. Furthermore, other examples of the organic semiconductor material include a compound selected from the group consisting of a condensation polycyclic aromatic compound, porphyrin-based derivative, phenylvinylidene-based conjugated oligomer, and thiophene-based conjugated oligomer. Specific examples of such a compound include a condensation polycyclic aromatic compound such as acene-based molecules (pentacene and tetracene, for instance), porphyrin-based molecules, and conjugated oligomer (phenylvinylidene type and thiophene type, for instance).

Moreover, other examples of the organic semiconductor materials include porphyrin; 4,4'-biphenyldithiol (BPDT); 4,4'-diisocyanobiphenyl; 4,4'-diisocyano-p-terphenyl; 2,5-bis(5'-thioacetyl-2'-thiophenyl)thiophene; 2,5-bis(5'-thioacetoxyl-2'-thiophenyl)thiophene; 4,4'-diisocyanophenyl; benzidine(biphenyl-4,4'-diamine); tetracyanoquinodimethane (TCNQ); charge-transfer complexes such as a tetrathiafulvalene (TTF)-TCNQ complex, bisethylenetetrathiafulvalene (BEDTTTF)-perchloric acid complex, BEDTTTF-iodine complex, and TCNQ-iodine complex; 4,4'-biphenyldicarboxylic acid; 1,4-di(4-thiophenylacetylinyl)-2-ethylbenzene; 1,4-di(4-isocyanophenylacetylinyl)-2-ethylbenzene; dendrimer; fullerene such as C60, C70, C76, C78, and C84; 1,4-di(4-thiophenylethynyl)-2-ethylbenzene; 2,2"-dihydroxy-1,1':4',1"-terphenyl; 4,4'-biphenyl diethanal; 4,4'-biphenyldiol; 4,4'-biphenyl diisocyanate; 1,4-diacetylbenzene; diethyl biphenyl-4,4'-dicarboxylate; benzo[1,2-c; 3,4-c'; 5,6-c"]tris[1,2]dithiol-1,4,7-trithione; α-sexithiophene; tetrathiotetracene; tetraselenotetracene; tetratellurotetracene; poly(3-alkylthiophene); poly(3-thiophene-β-ethanesulfonic acid); poly(N-alkyl pyrrole)poly(3-alkyl pyrrole); poly(3,4-dialkylpyrrole); poly(2,2'-thienylpyrrole); and poly (dibenzothiophene sulfide).

The active layer and channel-forming region (layer of the organic material) may appropriately contain a polymer. A polymer which can be dissolved in an organic solvent may be used. Specific examples of the polymer (organic binder and another type of binder) include polystyrene, poly-α-methylstyrene, and polyolefin. In addition, additives (for example, doping materials such as n-type dopant and p-type dopant) may be also contained if necessary.

Examples of the solvent used for preparing a solution of the organic semiconductor material include aromatics such as toluene, xylene, mesitylene, and tetralin; ketones such as cyclopentanone and cyclohexanone; and hydrocarbons such as decalin. Among these, materials having relatively high boiling point, such as mesitylene, tetralin, and decalin, are preferably used in view of transistor characteristics and prevention of drastic drying of the layer of the organic semiconductor material during the formation thereof.

A coating method can be used as a method of forming the active layer, channel-forming region, and channel-forming region extension. In this case, traditional coating methods can be used without problems. For example, the various types of coating methods described above may be employed in particular.

Examples of the supporting base (supporting substrate) include various types of glass substrates, various types of glass substrate having a surface on which an insulating film is formed, a quartz substrate, a quarts substrate having a surface on which an insulating film is formed, a silicon substrate having a surface on which an insulating film is formed, sapphire substrate, and metallic substrate formed by using various types of alloys, such as stainless steel, and various types of metals.

Examples of a material used for the control electrode, first electrode, second electrode, gate electrode, and source/drain electrodes include metals such as platinum (Pt), gold (Au), palladium (Pd), chromium (Cr), molybdenum (Mo), nickel (Ni), aluminum (Al), silver (Ag), tantalum (Ta), tungsten (W), copper (Cu), titanium (Ti), indium (In), tin (Sn), iron (Fe), cobalt (Co), zinc (Zn), and magnesium (Mg); alloys containing these metals; conductive particles containing such metals; conductive particles containing alloys of such metals; and conductive materials such as polysilicon containing a dopant. The electrodes may be configured so as to have a structure in which layers containing the above materials are stacked. Other examples of the material used for the control electrode, first electrode, second electrode, gate electrode, and source/drain electrodes include organic materials (conductive polymers) such as PEDOT/PSS and polyaniline. The control electrode, first electrode, second electrode, gate electrode, and source/drain electrodes may be formed by using the same or different materials.

Although a method of forming the control electrode, first electrode, second electrode, gate electrode, and source/drain electrodes depends on the materials thereof, examples of the method include the various types of coating methods described above; a physical vapor deposition (PVD) method; pulsed laser deposition (PLD) method; arc discharge method; various types of chemical vapor deposition (CVD) methods including a metalorganic chemical vapor deposition (MOCVD) method; lift-off technique; shadow mask technique; and plating technique such as electroplating, electroless plating, or combination thereof, and these may be used alone or in combination with a patterning method where appropriate. Examples of the PVD method include (a) various types of vapor deposition methods such as electron-beam heating, resistance heating, flash deposition, and a technique in which a crucible is heated; (b) plasma deposition technique, (c) various types of sputtering such as diode sputtering, direct current (DC) sputtering, DC magnetron sputtering, radio frequency (RF) sputtering, magnetron sputtering, ion beam sputtering, and bias sputtering; and (d) various types of ion plating such as a DC method, PF method, multi-cathode method, activated reaction method, field evaporation method, high-frequency ion plating method, and reactive ion plating method. In the case of forming a resist pattern, for example, a resist film is formed as a result of applying a resist material, and the resist film is then patterned by a photolithographic method, laser drawing method, electron beam drawing method, or X-ray drawing method. The resist pattern may be formed by using a resist transfer method or the like. In the case of forming the control electrode, first electrode, second electrode, gate electrode, and source/drain electrodes by an etching method, a dry etching method or a wet etching method may be used. Examples of the dry etching method include ion milling and reactive ion etching (RIE). Furthermore, the control electrode, first electrode, second electrode, gate electrode, and source/drain electrodes may be formed by laser ablation, mask evaporation, laser transfer, or the like.

The insulating layer or gate insulating layer (hereinafter collectively referred to as "gate insulating layer or the like", where appropriate) may have a single layer structure or multilayer structure. Examples of a material used for the gate insulating layer or the like include inorganic insulating materials traditionally used for a metallic oxide high-dielectric insulating film [such as a silicon oxide-based material, silicon nitride ($SiN_Y$), aluminum oxide ($Al_2O_3$), and hafnium oxide ($HfO_2$)] and also include organic insulating materials (organic polymer) such as linear hydrocarbons in which one end has a functional group that can be bonded to the control electrode and gate electrode [for instance, polymethylmethacrylate (PMMA); polyvinyl phenol (PVP); polyvinyl alcohol (PVA); polyimide; polycarbonate (PC); polyethylene terephthalate (PET); polystyrene; silanol derivatives (silane coupling agent) such as N-2(aminoethyl)-3-aminopropyltrimethoxysilane (AEAPTMS),3-mercaptopropyltrimethoxysilane (MPTMS), and octadecyltrichlorosilane (OTS); octadecanethiol; and dodecyl isocyanate], and these material may be used in combination. Examples of the silicon oxide-base material include silicon oxide ($SiO_x$), boron phosphorus silicate glass (BPSG), phosphorus silicate glass (PSG), boron silicate glass (BSG), arsenic silicate glass (AsSG), lead silicate glass (PbSG), silicon oxynitride (SiON), spin on glass (SOG), and a low-permittivity $SiO_2$-base material (such as polyarylether, cycloperfluorocarbon polymer, benzocyclobutene, cyclic fluorine resin, polytetrafluoroethylene, arylether fluoride, polyimide fluoride, amorphous carbon, or organic SOG).

Examples of a method of forming the gate insulating layer or the like include, in addition to the above coating method, a lift-off technique, sol-gel method, electrodeposition method, and shadow mask technique, and these method may be used alone or in combination with a patterning technique.

Furthermore, the gate insulating layer can be formed as a result of oxidizing or nitriding a surface of the control electrode or gate electrode and can be formed as a result of forming an oxide film or nitride film on a surface of the control electrode or gate electrode. A method of oxidizing a surface of the control electrode or gate electrode depends on the material used for the control electrode or gate electrode, and examples of the method include an oxidation method using $O_2$ plasma and anodic oxidation method. A method of nitriding a surface of the control electrode or gate electrode depends on the material used for the control electrode or gate electrode, and examples of the method include a nitriding method using $N_2$ plasma. Moreover, in an Au electrode, for example, a technique such as a dipping method can be used to cover a surface of the control electrode or gate electrode in the self-organizing manner with the aid of insulating molecules having a functional group which can chemically form a bond with the control electrode or gate electrode, such as linear hydrocarbons in which one end is modified by a mercapto group, so that the insulating layer is formed on a surface of the control electrode or gate electrode. Moreover, a surface of the control electrode or gate electrode can be modified by a silanol derivative (silane coupling agent), thereby being able to form the insulating layer.

In the case where the thin-film device of an embodiment of the present disclosure is applied to or used for a display apparatus and various types of electronic equipment, the thin-film device may be provided as a monolithic integrated circuit in which the second substrate is integrated with a large number of thin-film devices (such as an electronic device and semiconductor device). In addition, the individual thin-film devices may be cut to be individuated and may be provided as discrete parts. The thin-film device may be sealed by resin.

Example 1

Figure 1B:
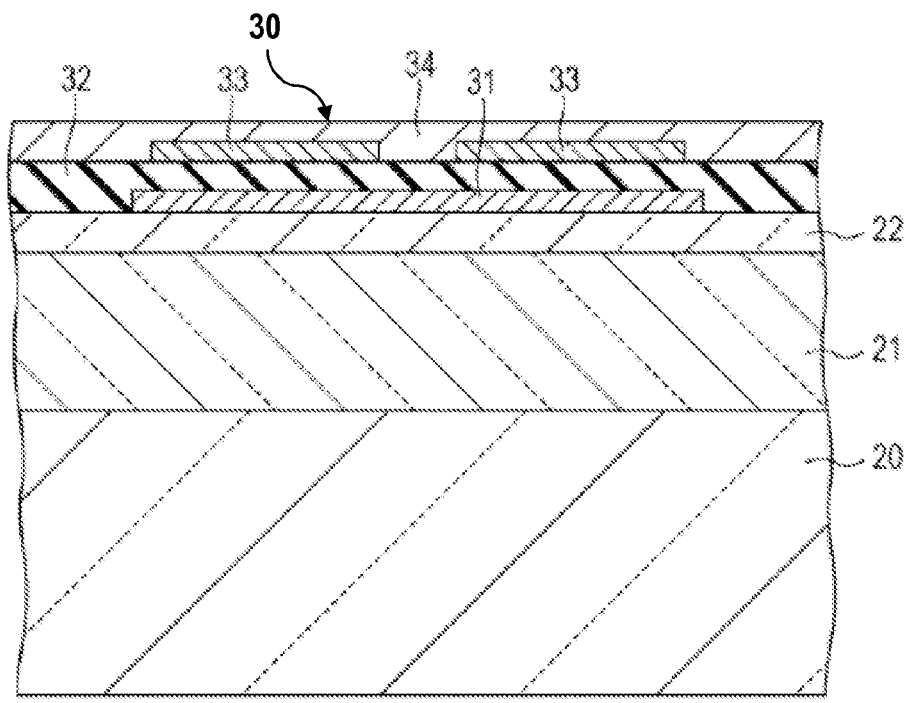
FIG. 1B is a partial cross-sectional view schematically illustrating a supporting base and other portions and serves to describe a method of manufacturing the thin-film device of the example 1.

The example 1 relates to the thin-film devices of the first to third embodiments of the present disclosure, the method of manufacturing the thin-film devices of the first to third embodiments, and the method of manufacturing the image display apparatus of the present disclosure. FIG. 1A is a partial cross-sectional view schematically illustrating a thin-film device 10A of the example 1. FIG. 1B is a partial cross-sectional view schematically illustrating a supporting base and other portions and serves to illustrate a method of manufacturing the thin-film device of the example 1.

The thin-film device 10A of the example 1 includes a first substrate 21, a second substrate 22 formed on the first substrate 21, and an active element 30 formed on the second substrate 22.

In accordance with the first embodiment of the present disclosure, a resin material is used to form the first substrate 21 and has a glass transition temperature $T_g$ of 180° C. or higher, and the second substrate 22 is formed by using a thermosetting resin or energy ray-curable resin.

In accordance with the second embodiment of the present disclosure, the resin material used for the first substrate 21 has a glass transition temperature $T_g$ higher than the maximum (150° C., in particular) of a processing temperature during the formation of the active element 30. The second substrate 22 is formed by using a thermosetting resin or energy ray-curable resin. In this case, the resin material used for the first substrate 21 has a glass transition temperature $T_g$ of 180° C. or higher.

In accordance with the third embodiment of the present disclosure, an amorphous thermoplastic resin is employed as the resin material used for the first substrate 21, and a thermosetting resin or ultraviolet curable resin is employed as the resin used for the second substrate 22. In this case, a polysulfone-based resin is employed as the amorphous thermoplastic resin used for the first substrate 21.

In the thin-film device 10A of the example 1, a peel strength (in particular, 90° peel strength) is exhibited to a supporting base 20 in the range from 1.0 N/cm (0.1 kgf/cm) to 4.9 N/cm (0.5 kgf/cm). In this case, a polysulfone resin is employed as the amorphous thermoplastic resin used for the first substrate 21 as described above, and an epoxy-based resin is employed as the thermosetting resin used for the second substrate 22.

In the example 1, the active element 30 includes first and second electrodes, an active layer formed between the first and second electrodes, and a control electrode formed so as to face the active layer through an insulating layer. The active layer 30 is specifically formed as an FET and more specifically formed as a TFT. The first and second electrodes correspond to source/drain electrodes 33, the control electrode corresponds to a gate electrode 31, and the insulating layer corresponds to a gate insulating layer 32, and the active layer corresponds to a channel-forming region 34. A voltage is applied to the control electrode with the result that a current flowing from the first electrode toward the second electrode through the active layer is controlled.

In this case, the active element 30 formed as the TFT is further specifically formed so as to have a bottom gate and bottom contact-type configuration. The active element 30 has (A) the gate electrode 31 (corresponding to the control electrode) formed on the second substrate 22; (B) the gate insulating layer 32 (corresponding to the insulating layer) formed on the gate electrode 31 and second substrate 22; (C) the source/drain electrodes 33 (corresponding to the first and second electrodes) formed on the gate insulating layer 32; and (D) the channel-forming region 34 (corresponding to the active layer) formed between the source/drain electrodes 33 so as to overlie the gate insulating layer 32, the channel-forming region 34 being formed as a layer of an organic semiconductor material.

In the example 1, gold (Au) is used to form the control electrode (gate electrode 31) and first and second electrodes (source/drain electrodes 33), $SiO_2$ is used to form the insulating layer (gate insulating layer 32), and triisopropylsilyl (TIPS)-pentacene is used to form the active layer (channel-forming region 34).

A method of manufacturing a thin-film device and a method of manufacturing an image display apparatus according to the example 1 will be hereinafter described. In the following description, the control electrode and gate electrode are collectively referred to as a gate electrode, the first and second electrodes and source/drain electrodes are collectively referred to as source/drain electrodes, the insulating layer and gate insulating layer are collectively referred to as a gate insulating layer, and the active layer and channel-forming region are collectively referred to as a channel-forming region.

A solution of an organic semiconductor material is prepared in advance. In particular, TIPS-pentacene as the organic semiconductor material of 1 gram was dissolved in 1,2,3,4-tetrahydronaphthalene as an organic solvent of 100 gram. In addition, a first substrate-forming solution and a second substrate-forming solution are prepared, the first substrate-forming solution being prepared as a result of dissolving polysulfone (glass transition temperature $T_g$: 180° C.) in n-methylpyrrolidone, and the second substrate-forming solution being prepared as a result of dissolving an epoxy-based resin (in particular, o-cresol novolac epoxy resin) in cyclopentanone.

Process-100

The first substrate 21 is first formed on the supporting base 20 (supporting base) by a coating method using the resin material, and the second substrate 22 is then formed on the first substrate 21 by using a thermosetting resin. Alternatively, the first substrate 21 is formed on the supporting base 20 by a coating method using an amorphous thermoplastic resin, and the second substrate 22 is then formed on the first substrate 21 by using a thermosetting resin. In particular, the first substrate-forming solution is applied onto a glass substrate provided as the supporting base 20 by using a bar coater and is then dried so as to have a thickness of 100 μm, thereby forming the first substrate 21 on the supporting base 20. The second substrate-forming solution is subsequently applied on the first substrate 21 and is then thermally cured by drying so as to have a thickness of 10 μm, thereby forming the second substrate 22 on the first substrate 21.

The active section 30 is subsequently formed on the second substrate 22.

Process-110

In order to form the active section 30, the gate electrode 31 is formed on the second substrate 22. In particular, a resist layer (not illustrated), in which a portion in which the gate electrode 31 is formed has been removed, is formed by a lithographic technique. A titanium (Ti) layer (not illustrated) as an adhesion layer and a gold (Au) layer as the gate electrode 31 are formed on the entire surface of the resultant product by a vapor deposition method in sequence, and the resist layer is then removed. The gate electrode 31 can be formed by a so-called lift-off technique in this manner.

Process-120

The gate insulating layer 32 is then formed on the entire surface of the resultant product, specifically on the gate electrode 31 and second substrate 22. In more particular, the gate insulating layer 32 is formed using $SiO_2$ on the gate electrode 31 and second substrate 22 by a sputtering method. In the formation of the gate insulating layer 32, the gate electrode 31 is partially covered with a hard mask, thereby being able to form the connection portion (not illustrated) of the gate electrode 31 without a photolithography process.

Process-130

The source/drain electrodes 33 are then formed on the gate insulating layer 32 in the form of gold (Au) layers. In particular, a titanium (Ti) layer (not illustrated) as an adhesion layer having a thickness of approximately 0.5 nm and gold (Au) layers as the source/drain electrodes 33 having a thickness of 25 nm are formed by a vapor deposition method in sequence. In the formation of these layers, the gate insulating layer 32 is partially covered with a hard mask, thereby being able to form the source/drain electrodes 33 (not illustrated) without a photolithography process.

Process-140

Then, the solution of the organic semiconductor material is applied on the gate insulating layer 32 at a position at least between the source/drain electrodes 33 and is subsequently dried, thereby forming the channel-forming region 34 in the form of a layer of the organic semiconductor material. In particular, the layer of the organic semiconductor material is formed by a spin coat method using the solution of the organic semiconductor material described above. The resultant layer of the organic semiconductor material is subsequently dried at a temperature of 90° C. for an hour. The channel-forming region 34 (active layer) can be formed in this manner (see FIG. 1B).

Alternately, the layer of the organic semiconductor material is formed by an ink-jet printing technique using the solution of the organic semiconductor material described above. The resultant layer of the organic semiconductor material is subsequently dried at a temperature of 90° C. for an hour, thereby also being able to form the channel-forming region 34 (active layer).

Process-150

Then, a passivation layer (not illustrated) is formed on the entire surface of the resultant product, and wiring (not illustrated) connected to the gate electrode 31 and source/drain electrodes 33 is formed as a result of printing and subsequent calcining of silver paste. In this case, a temperature at which the silver paste is calcined is the maximum (150° C., in particular) of a processing temperature in a set of the processes of manufacturing the thin-film device and image display apparatus. In this manner, a bottom gate and bottom contact-type FET (TFT, in particular) can be produced.

Process-160

Then, the supporting base 20 is removed from the first substrate 21. In particular, cut lines are formed in the second substrate 22 and first substrate 21 formed so as to overlie the supporting base 20, and water is made to intrude from the cut lines, thereby removing the supporting base 20 from the first substrate 21. In this manner, the thin-film device (TFT) 10A of the example 1 can be produced. Furthermore, an image display apparatus including the thin-film device 10A of the example 1 can be produced. In order to manufacture the image display apparatus, an image display (in particular, an image display including an organic electroluminescence device, microcapsule-type electrophoretic display device, or semiconductor light-emitting device) may be formed on or above the thin-film device 10A by a traditional method after this process.

In the method of manufacturing a thin-film device and the method of manufacturing an image display apparatus according to the example 1, the active element 30 is formed so as to overlie the two-layered structure including the first substrate 21 and second substrate 22, and the supporting base 20 is then removed from the first substrate 21. The thin-film device 10A can be therefore manufactured through a simple and easy process without large-scale manufacturing equipment.

In addition, since the active element 30 is formed on the second substrate 22 in a state in which the first substrate 21 is covered with the second substrate 22, the first substrate 21 can be prevented from the occurrence of cracks, for instance, resulting from the contact of the first substrate 21 with a ketone-based solvent such as acetone during the formation of the active element 30. For example, in a traditional technique of manufacturing an organic transistor, a plastic film is attached to a supporting base by using an adhesive material or the like, the organic transistor is formed on the plastic film, and the plastic film on which the organic transistor has been formed is then removed from the supporting base. As compared with such a technique, an adhesive material is not used in an embodiment of the present disclosure, a typical problem can be therefore overcome, in which the adhesive material partially remains on the plastic film in the removal of the plastic film from the supporting base and is then removed in an additional process.

The occurrence of damage in the first substrate 21 can be evaluated, for example, in the following manner: the first substrate 21 is immersed into acetone and is allowed to stand at a temperature of 60° C. for 30 minutes; and the first substrate 21 is subsequently retrieved from the solvent, and the surface of the first substrate 21 is then visually observed. In order to evaluate the 90° peel strength of the first substrate 21 to the supporting base 20, TENSILON (commercially available from A&D Company, Limited) is used. A surface of the glass substrate is washed to be cleaned, and the first substrate-forming solution is applied onto the glass substrate with a bar coater and is then dried so as to have a thickness of 100 μm, thereby forming the fist substrate 21 on the glass substrate. Then, the 90° peel strength may be measured in accordance with JIS K 6854-1:1999.

Since the first substrate 21 is formed on the supporting base 20 by a coating method, the first substrate 21 can be easily formed, and bubbles are less likely to be caused between the supporting base 20 and the first substrate 21. In the thin-film device 10A of the example 1, the materials used for the first substrate 21 and second substrates 22 and the properties, details, and particulars of the materials are defined. The thin-film device 10A can be therefore manufactured through a simple and easy process without large-scale manufacturing equipment.

In place of the epoxy-based resin, a diallyl phthalate resin is applied onto the first substrate 21 to form the second substrate 22, and ultraviolet is radiated to cure the second substrate 22, thereby producing a two-layered structure of the substrates. Also in this case, the first substrate 21 can be prevented from the occurrence of cracks, for instance, resulting from the contact of the first substrate 21 with a ketone-based solvent such as acetone during the formation of the active element 30.

Except that the second substrate 22 was not formed, the same processes as employed in the example 1 were similarly used, thereby manufacturing a thin-film device of a comparison example 1A. As a result, in the case where the first substrate 21 contacted with a ketone-based solvent such as acetone during the formation of the active element 30, for example, the first substrate 21 was not dissolved but suffered from damage such as the occurrence of cracks. It is believed that such cracks result from stress caused inside the first substrate 21.

In a comparison example 1B, the first substrate 21 was formed as a layer of a polyimide resin (thickness after drying: 100 μm) on the supporting base 20. In addition, the second substrate 22 was not formed, and the same processes as employed in the example 1 were similarly used except these changes, thereby manufacturing a thin-film device. As a result, in the process the same as the process-160 of the example 1, the supporting base 20 had difficulty to be removed from the layer of the polyimide resin.

In a comparison example 1C, except that polyacrylate having a glass transition temperature $T_g$ of 110° C. was used to form the first substrate 21 on the supporting base 20, the same processes as employed in the example 1 were similarly used, thereby manufacturing a thin-film device. In particular, as in the case of the example 1, o-cresol novolac epoxy resin was used to form the second substrate 22 on the first substrate 21. As a result, the first substrate 21 peeled from the supporting base 20 during the formation of the active element 30 with the result that the manufacturing of a thin-film device failed.

Example 2

Figure 2A:
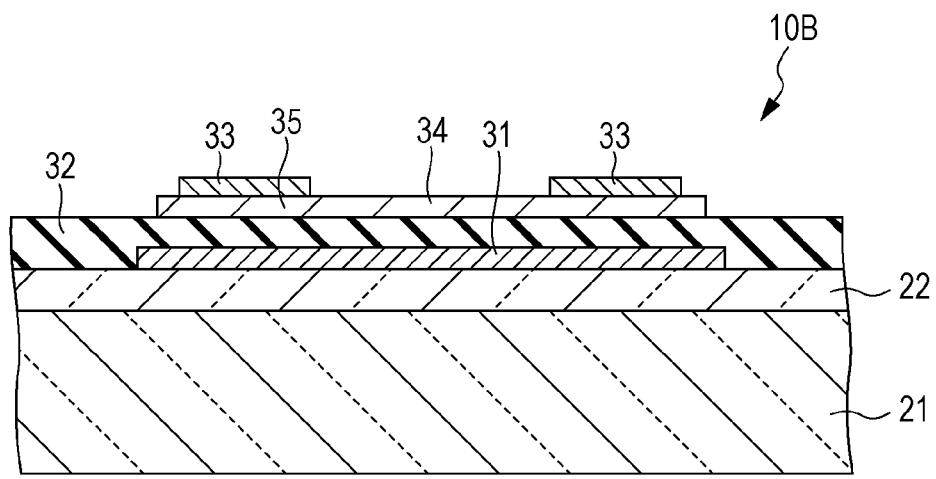
FIG. 2A is a partial cross-sectional view schematically illustrating a thin-film device of an example 2.

The example 2 is a modification of the example 1. In the example 2, a thin-film device 10B is formed as a bottom gate and top contact-type FET (in particular, TFT). With reference to FIG. 2A which is a partial cross-sectional view schematically illustrating the FET of the example 2, the FET includes (A) a gate electrode 31 (corresponding to the gate electrode) formed on the second substrate 22; (B) a gate insulating layer 32 (corresponding to the insulating layer) formed on the gate electrode 31 and second substrate 22; (C) a channel-forming region 34 (corresponding to the active layer) and channel-forming region extension 35 formed on the gate insulating layer 32, the channel-forming region 34 and channel-forming region extension 35 being used as layers of an organic semiconductor material; and (D) source/drain electrodes 33 (corresponding to the first and second electrodes) formed on the channel-forming region extension 35.

A method of manufacturing a thin-film device 10B of the example 2 will be hereinafter described.

Process-200

The first substrate 21 and the second substrate 22 are first formed on the supporting base 20 in sequence as in the case of the process-100 of the example 1. The gate electrode 31 is formed on the second substrate 22 as in the case of the process-110 of the example 1, and the gate insulating layer 32 is then formed on the entire surface of the resultant product, specifically on the gate electrode 31 and second substrate 22, as in the case of the process-120 of the example 1.

Process-210

As in the case of the process-140 of the example 1, the solution of the organic semiconductor material is then applied onto the gate insulating layer 32 and is subsequently dried, thereby forming the channel-forming region 34 and channel-forming region extension 35 as the layers of the organic semiconductor material.

Process-220

The source/drain electrodes 33 are formed on the channel-forming region extension 35 such that the channel-forming region 34 is positioned between the source/drain electrodes 33. In particular, as in the case of the process-130 of the example 1, a titanium (Ti) layer (not illustrated) as an adhesion layer and gold (Au) layers as the source/drain electrodes 33 are formed in sequence by a vapor deposition method. In the formation of these layers, the channel-forming region extension 35 is partially covered with a hard mask, thereby being able to form the source/drain electrodes 33 (not illustrated) without a photolithography process.

Process-230

Then, a passivation layer (not illustrated) and wiring (not illustrated) are formed as in the case of the example 1, and the supporting base 20 is subsequently removed from the first substrate 21, thereby being able to complete the thin-film device 10B of the example 2.

Example 3

Figure 2B:
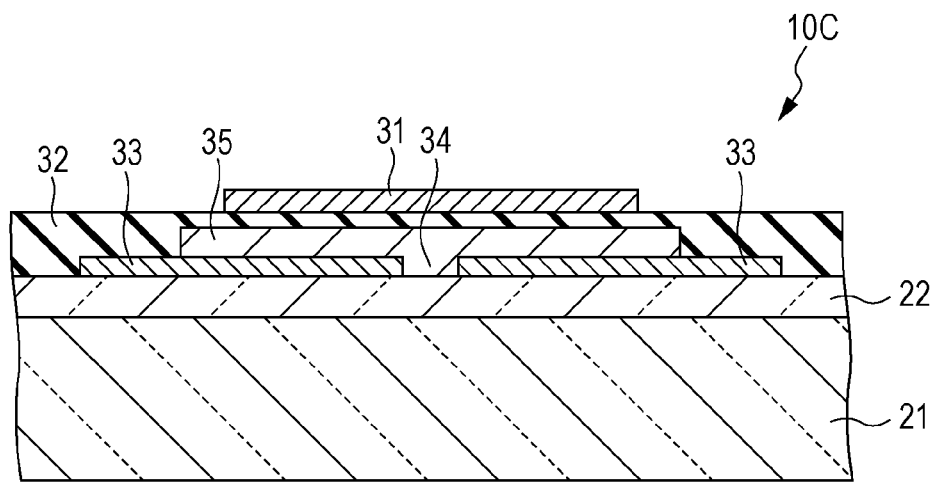
FIG. 2B is a partial cross-sectional view schematically illustrating a thin-film device of an example 3.

The example 3 is also a modification of the example 1. In the example 3, a thin-film device 10C is formed as a top gate and bottom contact-type FET (in particular, TFT). With reference to FIG. 2B which is a partial cross-sectional view schematically illustrating the FET of the example 3, the FET includes (A) the source/drain electrodes 33 (corresponding to first and second electrodes) formed on the second substrate 22; (B) the channel-forming region 34 (corresponding to the active layer) formed on the second substrate 22 so as to be positioned between the source/drain electrodes 33, the channel-forming region 34 being formed as a layer of an organic conductor material; (C) the gate insulating layer 32 (corresponding to the insulating layer) formed on the channel-forming region 34; and (D) the gate electrode 31 (corresponding to the control electrode) formed on the gate insulating layer 32.

A method of manufacturing a thin-film device of the example 3 will be hereinafter described.

Process-300

As in the case of the process-100 of the example 1, the first substrate 21 and second substrate 22 are first formed on the supporting base 20 in sequence. Then, as in the case of the process-130 of the example 1, the source/drain electrodes 33 are formed on the second substrate 22. The solution of the organic semiconductor material is applied onto the entire surface of the resultant product, specifically on the source/drain electrodes 33 and second substrate 22, and is subsequently dried as in the case of the process-140 of the example 1, thereby forming the channel-forming region 34 (active layer) as a layer of the organic conductor material.

Process-310

The gate insulating layer 32 is then formed on the entire surface of the resultant product in the same manner as the process-120 of the example 1. The gate electrode 31 is subsequently formed on the gate insulating layer 32 in the same manner as the process-110 of the example 1 so as to overlie the channel-forming region 34.

Process-320

Then, a passivation layer (not illustrated) and wiring (not illustrated) are formed as in the case of the example 1, and the supporting base 20 is subsequently removed from the first substrate 21, thereby being able to complete the thin-film device 10C of the example 3.

Example 4

Figure 3A:
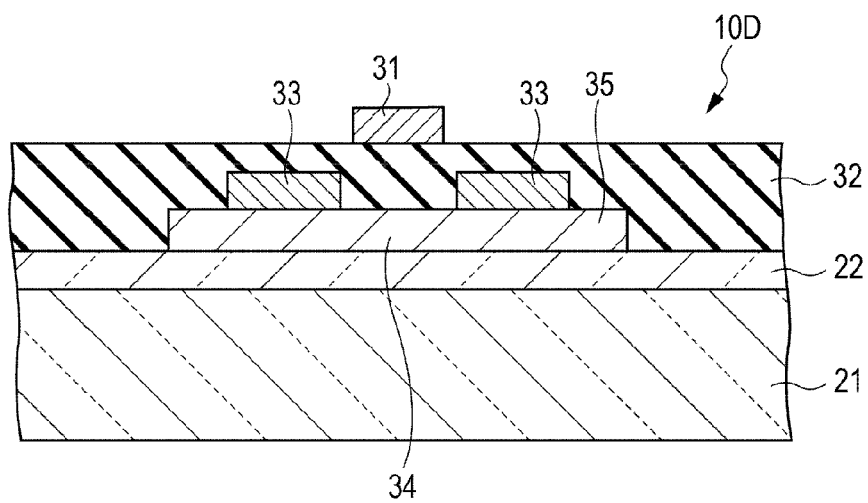
FIG. 3A is a partial cross-sectional view schematically illustrating a thin-film device of an example 4.

The example 4 is also a modification of the example 1. In the example 4, a thin-film device 10D is formed as a top gate and top contact-type FET (in particular, TFT). With reference to FIG. 3A which is a partial cross-sectional view schematically illustrating the FET of the example 4, the FET includes (A) the channel-forming region 34 (corresponding to the active layer) and channel-forming region extension 35 formed on the second substrate 22, the channel-forming region 34 and channel-forming region extension 35 being formed as layers of an organic conductor material; (B) the source/drain electrodes 33 (corresponding to the first and second electrodes) formed on the channel-forming region extension 35; (C) the gate insulating layer 32 (corresponding to the insulating layer) formed on the source/drain electrodes 33 and channel-forming region 34; and (D) the gate electrode 31 (corresponding to the control electrode) formed on the gate insulating layer 32.

A method of manufacturing a thin-film device of the example 4 will be hereinafter described.

Process-400

As in the case of the process-100 of the example 1, the first substrate 21 and second substrate 22 are first formed on the supporting base 20 in sequence. Then, as in the case of the process-140 of the example 1, the solution of the organic semiconductor material is applied onto the second substrate 22 and is subsequently dried, thereby forming the channel-forming region 34 and channel-forming region extension 35 as layers of the organic semiconductor material.

Process-410

The source/drain electrodes 33 are then formed on the channel-forming region extension 35 in the same manner as the process-130 of the example 1.

Process-420

The gate insulating layer 32 is subsequently formed on the entire surface of the resultant product in the same manner as the process-120 of the example 1. The gate electrode 31 is then formed on the gate insulating layer 32 in the same manner as the process-110 of the example 1 so as to overlie the channel-forming region 34.

Process-430

Then, a passivation layer (not illustrated) and wiring (not illustrated) are formed as in the case of the example 1, and the supporting base 20 is subsequently removed from the first substrate 21, thereby being able to complete the thin-film device 10D of the example 4.

Example 5

The example 5 is a modification of the examples 1 to 4. In the example 5, a resin material which is not cured or cross-linked, specifically polysulfone, is employed as the resin material used for the first substrate 21. The material used for the second substrate 22 contains the material used for the first substrate 21. Except these points, a thin-film device 10D of the example 5 can be manufactured so as to have formation and structure the same as those of the thin-film devices of the examples 1 to 4 and can be manufactured by the same methods as employed in the examples 1 to 4. The detailed description of the method of manufacturing a thin-film device according to the example 5 is therefore omitted.

Example 6

Figure 3B:
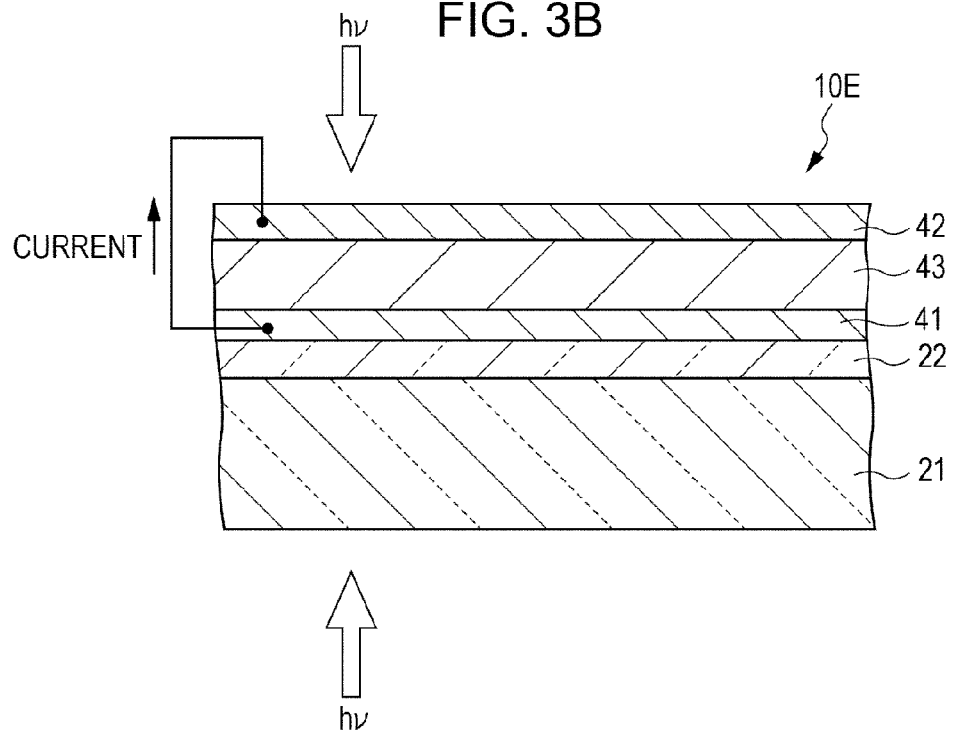
FIG. 3B is a partial cross-sectional view schematically illustrating a thin-film device of an example 6.

The example 6 is also a modification of the example 1. In the example 6, the active element of the example 6 is specifically formed as a two-terminal device. In more particular, with reference to FIG. 3B which is a partial cross-sectional view schematically illustrating a thin-film device 10E, the thin-film device 10E includes a first electrode 41, a second electrode 42, and an active layer 43 disposed between the first electrode 41 and second electrode 42. In this case, the active layer 43 is formed as a layer of an organic semiconductor material. Light emission to the active layer 43 causes electric power to be generated. In other words, the thin-film device 10E of the example 6 functions as a photoelectric transducer or solar battery. Furthermore, the thin-film device 10E serves as a light-emitting device in which the active layer 43 emits light as a result of application of a voltage between the first electrode 41 and second electrode 42.

Except these points, the thin-film device 10E of the example 6 can be manufactured so as to basically have formation and structure the same as those of the thin-film device 10A of the example 1, and the detailed description of the method of manufacturing a thin-film device according to the example 6 is therefore omitted. The same process as the process-100 of the example 1 is conducted, and the first electrode 41, active layer 43, and second electrode 42 are then formed in sequence in the substantially same manners as the processes-130, 140, 130 of the example 1, respectively. Wiring is subsequently formed in the same manner as the process-150 of the example 1, and the supporting base 20 is then removed from the first substrate 21 in the same manner as the process-160 of the example 1, thereby being able to produce the thin-film device 10E of the example 6.

Although embodiments of the present disclosure have been described with reference to the preferable examples, embodiments of the present disclosure are not limited to the above examples. The structure, formation, forming conditions, and manufacturing conditions of each of the thin-film devices are provided just as examples and can be appropriately changed. In the case where the thin-film devices produced in embodiments of the present disclosure are applied to or used for a display apparatus and various types of electronic equipment, for example, the thin-film devices may be provided as a monolithic integrated circuit in which a substrate is integrated with a large number of the thin-film devices or may be provided as discrete parts which are produced as a result of cutting and then individuating the individual thin-film devices. Although the thin-film devices are mainly formed as a three-terminal or two-terminal device in the examples, the thin-film devices may be provided as an organic electroluminescence device, microcapsule-type electrophoretic display device, or semiconductor light-emitting device each having typical formation and structure. In this case, a traditional method may be employed to manufacture such an organic electroluminescence device, microcapsule-type electrophoretic display device, or semiconductor light-emitting device.

The present disclosure contains subject matter related to that disclosed in Japanese Priority Patent Application JP 2011-081404 filed in the Japan Patent Office on Apr. 1, 2011, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method of manufacturing a thin-film device, the method comprising:
    forming a first substrate on a supporting base by a coating method, the first substrate being formed by using a resin material;
    forming a second substrate on the first substrate by using any one of a thermosetting resin and energy ray-curable resin;
    forming an active element on the second substrate; and
    removing the supporting base from the first substrate, wherein
    the resin material used to form the first substrate has a glass transition temperature of at least 180° C.

2. The method of manufacturing a thin-film device according to claim 1, wherein:
    any one of a non-curable resin material and non-cross-linked resin material is used to form the first substrate, and
    the material used for the second substrate contains a component of the resin material used for the first substrate.

3. The method of manufacturing a thin-film device according to claim 1, wherein a peel strength with respect to the supporting base is in the range from 1.0 N/cm to 4.9 N/cm.

4. The method of manufacturing a thin-film device according to claim 1, wherein the active element includes:
    first and second electrodes;
    an active layer formed between the first and second electrodes; and
    a control electrode which faces the active layer through an insulating layer.

5. The method of manufacturing a thin-film device according to claim 4, wherein
    the active element is formed as a thin-film transistor,
    the first and second electrodes function as source/drain electrodes,
    the control electrode functions as a gate electrode,
    the insulating layer functions as a gate insulating layer, and
    the active layer functions as a channel-forming region.

6. The method of manufacturing a thin-film device according to claim 4, wherein an organic semiconductor material is used to form the active layer.

7. The method of manufacturing a thin-film device according to claim 1, wherein the active element includes:
    first and second electrodes; and
    an active layer formed between the first and second electrodes.

8. The method of manufacturing a thin-film device according to claim 1, wherein the active element is formed as an organic electroluminescence device.

9. The method of manufacturing a thin-film device according to claim 1, wherein the active element is formed as a microcapsule-type electrophoretic display device.

10. A method of manufacturing an image display apparatus, the method comprising the method of manufacturing a thin-film device according to claim 1, wherein the thin-film device is included in the image display apparatus as a display portion of the image display apparatus.

11. A method of manufacturing a thin-film device, the method comprising:
forming a first substrate on a supporting base by a coating method, the first substrate being formed by using a resin material;
forming a second substrate on the first substrate by using any one of a thermosetting resin and energy ray-curable resin;
forming an active element on the second substrate; and
removing the supporting base from the first substrate, wherein,
the resin material used for the first substrate has a glass transition temperature higher than the maximum of a processing temperature during the formation of the active element.

12. The method of manufacturing a thin-film device according to claim 11, wherein the resin material used to form the first substrate has a glass transition temperature of at least 180° C.

13. The method of manufacturing a thin-film device according to claim 11, wherein a peel strength with respect to the supporting base is in the range from 1.0 N/cm to 4.9 N/cm.

14. A method of manufacturing a thin-film device, the method comprising:
forming a first substrate on a supporting base by a coating method, the first substrate being formed by using an amorphous thermoplastic resin;
forming a second substrate on the first substrate by using any one of a thermosetting resin and ultraviolet curable resin;
forming an active element on the second substrate; and
removing the supporting base from the first substrate.

15. The method of manufacturing a thin-film device according to claim 14, wherein a polysulfone-based resin is employed as the amorphous thermoplastic resin used for the first substrate.

16. The method of manufacturing a thin-film device according to claim 15, wherein any one of a polysulfone resin, polyether sulfone resin, and polyetherimide resin is employed as the amorphous thermoplastic resin used for the first substrate.

17. The method of manufacturing a thin-film device according to claim 14, wherein epoxy-based resin is employed as the thermosetting resin used for the second substrate.

* * * * *